US009165856B2

(12) United States Patent
Youn et al.

(10) Patent No.: US 9,165,856 B2
(45) Date of Patent: Oct. 20, 2015

(54) COUPLING ASSEMBLY OF POWER SEMICONDUCTOR DEVICE AND PCB AND METHOD FOR MANUFACTURING THE SAME

(71) Applicant: LSIS CO., LTD., Anyang-si, Gyeonggi-do (KR)

(72) Inventors: Bohyun Youn, Seoul (KR); Min Heo, Seoul (KR)

(73) Assignee: LSIS Co., Ltd., Anyang-Si, Gyeonggi-Do (KR)

( * ) Notice: Subject to any disclaimer, the term of this patent is extended or adjusted under 35 U.S.C. 154(b) by 286 days.

(21) Appl. No.: 14/018,932

(22) Filed: Sep. 5, 2013

(65) Prior Publication Data

US 2014/0070387 A1 Mar. 13, 2014

(30) Foreign Application Priority Data

Sep. 11, 2012 (KR) .................. 10-2012-0100489

(51) Int. Cl.
*H01L 23/40* (2006.01)
*H01L 23/00* (2006.01)
(Continued)

(52) U.S. Cl.
CPC ............... *H01L 23/40* (2013.01); *H01L 24/72* (2013.01);
(Continued)

(58) Field of Classification Search
CPC ............... H01L 2924/00014; H01L 2924/014; H01L 2924/00; H01L 2224/732; H01L 24/73; H01L 24/72; H01L 2224/371; H01L 2023/4087; H01L 2224/40106; H01L 2224/40227; H01L 23/40; H01L 24/91; H01L 2023/4062; H05K 1/0215; H05K 3/301; H05K 3/3421; H05K 2201/10409; H05K 1/0203; H05K 7/2049
See application file for complete search history.

(56) References Cited

U.S. PATENT DOCUMENTS

| 5,592,021 A | * | 1/1997 | Meschter et al. ............. 257/727 |
| 5,850,104 A | * | 12/1998 | Avis .............................. 257/726 |
| 7,450,387 B2 | * | 11/2008 | Cheng et al. .................. 361/704 |

FOREIGN PATENT DOCUMENTS

| JP | 62-55346 | 4/1987 |
| JP | 02-170593 | 7/1990 |

(Continued)

OTHER PUBLICATIONS

Japan Patent Office Application Serial No. 2013-187195, Office Action dated Jan. 16, 2015, 3 pages.

(Continued)

*Primary Examiner* — Roy Potter
(74) *Attorney, Agent, or Firm* — Lee, Hong, Degerman, Kang & Waimey

(57) ABSTRACT

Provided is a coupling assembly of a power semiconductor device and a printed circuit board (PCB). The coupling assembly of the power semiconductor device and the printed circuit board (PCB) includes a PCB, a power semiconductor device comprising a plurality of legs electrically connected to a circuit pattern disposed on the PCB, a connection member disposed above the power semiconductor device, the connection member being formed of an electrically conductive material, a main fixing unit fixing the power semiconductor device to the PCB, and a housing disposed outside the PCB. Thus, a coupling force between the power semiconductor device and the PCB and electric efficiency may be improved to a heat generation amount. In addition, heat may be more quickly dissipated through the connection member to improve a cooling effect.

18 Claims, 2 Drawing Sheets

(51) Int. Cl.
*H05K 3/30* (2006.01)
*H05K 7/20* (2006.01)
*H05K 1/02* (2006.01)
*H05K 3/34* (2006.01)

(52) U.S. Cl.
CPC .............. *H01L 24/73* (2013.01); *H01L 24/91* (2013.01); *H05K 3/301* (2013.01); *H05K 7/2049* (2013.01); *H01L 24/37* (2013.01); *H01L 2023/4062* (2013.01); *H01L 2023/4087* (2013.01); *H01L 2224/371* (2013.01); *H01L 2224/40106* (2013.01); *H01L 2224/40227* (2013.01); *H01L 2224/732* (2013.01); *H01L 2924/014* (2013.01); *H05K 1/0203* (2013.01); *H05K 1/0215* (2013.01); *H05K 3/3421* (2013.01); *H05K 2201/10409* (2013.01)

(56) References Cited

FOREIGN PATENT DOCUMENTS

| | | |
|---|---|---|
| JP | 08-001918 | 1/1996 |
| JP | 09-283886 | 10/1997 |
| KR | 10-1995-0028581 | 10/1995 |
| KR | 20-1998-028849 | 8/1998 |
| KR | 10-1999-0088559 | 12/1999 |
| KR | 10-2003-0087032 | 11/2003 |

OTHER PUBLICATIONS

Korean Intellectual Property Office Application Serial No. 10-2012-0100489, Notice of Allowance dated Apr. 14, 2014, 2 pages.
Japan Patent Office Application Serial No. 2013-187195, Office Action dated Apr. 28, 2014, 3 pages.
Korean Intellectual Property Office Application Serial No. 10-2012-0100489, Office Action dated Nov. 7, 2013, 4 pages.

\* cited by examiner

COUPLING ASSEMBLY OF POWER SEMICONDUCTOR DEVICE AND PCB AND METHOD FOR MANUFACTURING THE SAME

CROSS-REFERENCE TO RELATED APPLICATIONS

Pursuant to 35 U.S.C. §119(a), this application claims the benefit of earlier date and right of priority to Korean Patent Application No. 10-2012-0100489, filed on Sep. 11, 2012, the contents of which is incorporated by reference herein in its entirety.

BACKGROUND

The present disclosure relates to a coupling assembly of a power semiconductor device and a printed circuit board (PCB), and more particularly, to a coupling assembly of a power semiconductor device and a PCB, in which the power device is disposed between a connection member and the PCB to press the connection member toward the PCB, thereby firmly fixing the power semiconductor device to the PCB and improving cooling efficiency and electric efficiency.

A power semiconductor device used in electric/electronic devices such as power conversion devices according to a related art may have a structure in which the power semiconductor device is fixed to the inside of a housing by using a bolt or clip, and then a leg of the power semiconductor device is connected to a PCB or a structure in which the power semiconductor device is fixed to a PCB by using a clip or bolt without being directly attached to the inside of a housing.

FIG. 1 is a view illustrating an example of a coupling assembly in which a power semiconductor device is coupled to a PCB according to a related art. A power semiconductor device 10 is attached to the inside of a housing 30 by using a fixing bolt 40. A leg 11 of the power semiconductor device 10 is connected to a PCB 20 through soldering. According to the above-described structure, since the power semiconductor device 10 and the housing 30 directly contact each other, the power semiconductor device may be improved in heat dissipation and cooling.

However, since the leg 11 of the power semiconductor device 10 is coupled to the PCB 20 through the soldering, the assembly may be easily assembled, but be weak in vibration.

FIG. 2 is a view illustrating an example of a coupling assembly in which the other power semiconductor device 50 is coupled to a PCB 60 according to the related art. Unlike the forgoing coupling assembly according to the related art, the power semiconductor device 50 is attached to an upper portion of the PCB 60. Here, the power semiconductor device 50 is pressed and fixed to a top surface of the PCB 60 by using a fixing bolt and a clip 80.

Thus, although the power semiconductor device 50 is more firmly fixed to the PCB 60, since the power semiconductor device does not directly contact a housing (not shown), cooling efficiency may be deteriorated.

SUMMARY

Embodiments provide a coupling assembly of a power semiconductor device and a PCB, in which the power semiconductor device is firmly fixed to the PCB and also has improved heat dissipation efficiency.

Embodiments also provide a coupling assembly of a power semiconductor device and a PCB, in which a passage through which current flows is increased in area to improve electric efficiency of the power semiconductor device and to decrease a heat generation amount.

In one embodiment, a coupling assembly of a power semiconductor device and a printed circuit board (PCB) includes: a PCB; a power semiconductor device including a plurality of legs electrically connected to a circuit pattern disposed on the PCB; a connection member disposed above the power semiconductor device, the connection member being formed of an electrically conductive material; a main fixing unit fixing the power semiconductor device to the PCB; and a housing disposed outside the PCB, wherein the connection member includes: a flat plate part contacting an upper portion of the power semiconductor device; and a wing part extending downward from an end of the flat plate part, wherein an end of the wing part conductively contacts to the legs of the power semiconductor device.

At least one wing part may be provided, and the plurality of legs may conductively contact one wing part.

A vertical extending angle of the wing part may be closer to a vertical state than a vertical extending angle of each of the legs of the power semiconductor device.

The flat plate part may surface-contact a top surface of the power semiconductor device.

A ground may be disposed on the PCB, and the connection member may extend up to the ground.

The coupling assembly may further include an auxiliary fixing unit pressing and fixing the connection member to the ground.

In another embodiment, a method for manufacturing the coupling assembly of the power semiconductor device and the PCB according to an embodiment includes: soldering the power semiconductor device to the PCB to couple the power semiconductor device to the PCB; disposing the connection member on the upper portion of the power semiconductor device; disposing the PCB on which the connection member is disposed on the upper portion thereof within the housing; and coupling the connection member, the PCB, and the housing to each other by using the main fixing unit.

The method may further include coupling the connection member to the ground by using the auxiliary fixing unit between the disposing of the connection member on the upper portion of the power semiconductor device and the disposing the PCB on which the connection member is disposed on the upper portion thereof within the housing, wherein the auxiliary fixing unit may include at least one of soldering and a fixing bolt.

The details of one or more embodiments are set forth in the accompanying drawings and the description below. Other features will be apparent from the description and drawings, and from the claims.

DETAILED DESCRIPTION OF THE EMBODIMENTS

Hereinafter, a coupling assembly of a power semiconductor device and a printed circuit board (PCB) according to an embodiment will be described in detail with reference to the accompanying drawings.

Figure 1:
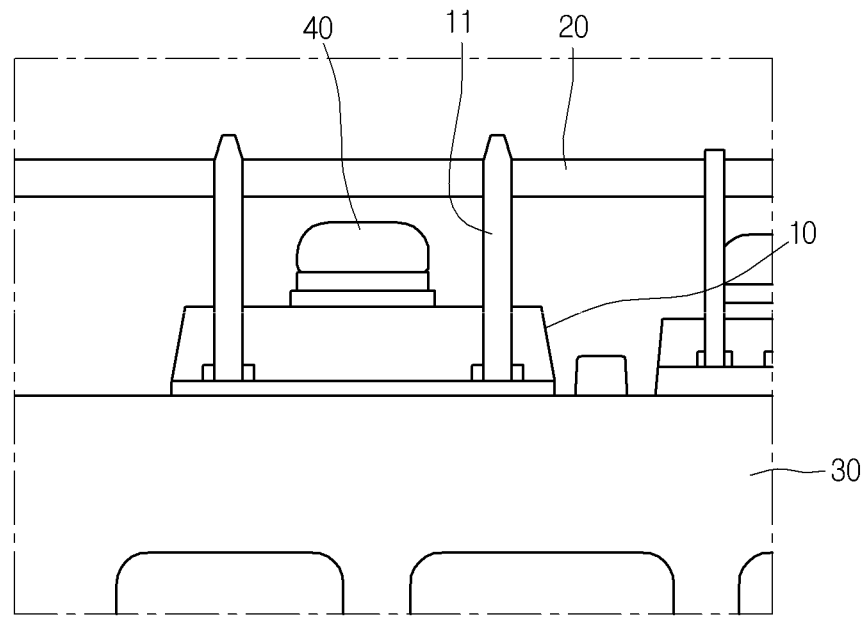
FIG. 1 is a view illustrating an example of a coupling assembly in which a power semiconductor device is coupled to a PCB according to a related art.
Figure 2:
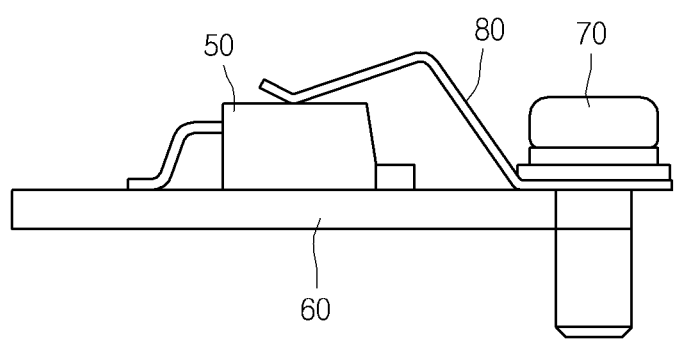
FIG. 2 is a view illustrating another example of the coupling assembly in which the power semiconductor device is coupled to the PCB according to a related art.
Figure 3:
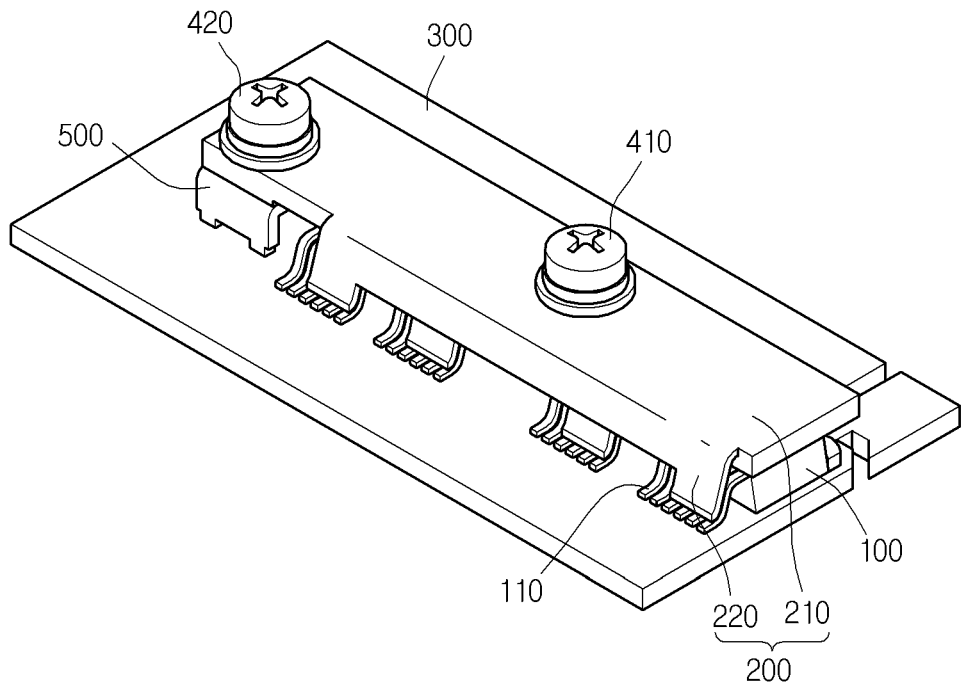
FIG. 3 is a schematic perspective view illustrating a coupling assembly of a power semiconductor device and a PCB according to an embodiment.
Figure 4:
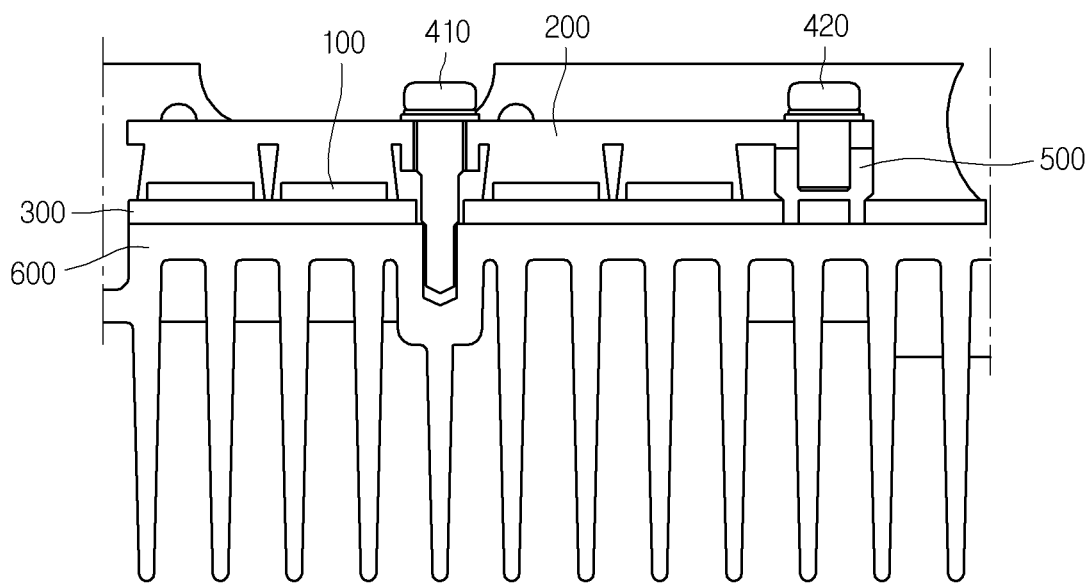
FIG. 4 is a schematic cross-sectional view of the coupling assembly of the power semiconductor device and the PCB according to an embodiment.

FIG. 3 is a schematic perspective view illustrating a coupling assembly of a power semiconductor device and a PCB according to an embodiment, and FIG. 4 is a schematic cross-sectional view of the coupling assembly of the power semiconductor device and the PCB according to an embodiment.

Although the coupling assembly of the power semiconductor device and the PCB is applied to a power conversion device in the current embodiment described with reference to FIGS. 3 and 4, the present disclosure is not limited thereto. For example, the coupling assembly of the power semiconductor device and the PCB may be applied to other electric/electronic device in addition to the power conversion device.

Referring to FIG. 3, a coupling assembly of a power semiconductor device and a PCB according to an embodiment includes a PCB 30, a power semiconductor device 100 coupled to an upper portion of the PCB 300, and a connection member 200 disposed above the power semiconductor device 100 to press the power semiconductor device 100 toward the PCB 300. Here, the connection member 200 may be called a common busbar. The connection member may be formed of an electrically conductive material, for example, copper.

Here, the power semiconductor device 100 is disposed above the PCB 300 and includes a plurality of legs 110. Each of the leg 110 is formed of an electrically conductive material and inclinedly extends in a vertical direction. An outer end of the leg 110 is soldered and electrically connected to a circuit pattern printed on the PCB 300.

The connection member 200 according to the current embodiment includes a flat plate part 210 having an approximately rectangular plane and a wing part 220 extending downward from one long side of the flat plate part 210.

The flat plate part 210 may contact a top surface of the power semiconductor device 100 to effectively dissipate heat generated in the power semiconductor device 100 through the surface contact therebetween.

Here, the wing part 220 inclinedly extends in a vertical direction. An inclined angle of the wing part 220 may be closer to a vertical state than the vertically inclined angle of the leg 110 of the power semiconductor device 100. Thus, when the connection member 200 is pressed from an upper side of the power semiconductor device 100 toward the PCB 300, the wing part 200 may press the leg of the power semiconductor device 110 to contact the connection member 200. Here, the contact state therebetween may be stably maintained.

The wing part 220 may be provided in plurality. Although four wing parts 220 are provided in the current embodiment, the present disclosure is not limited thereto. For example, the number of wing parts 220 may be selectable as necessary.

The wing part 220 may extend with a width that is enough to simultaneously contact the plurality of legs 110. In the current embodiment, the wing part 220 may have a width enough to simultaneously contact the four legs 110 in which current flows in the same direction. Due to the above-described structure, a passage through which current flows may be increased in area to improve electric efficiency, thereby reducing a heat generation amount of the power semiconductor device.

A ground 500 is disposed on the PCB 300. The flat plate part 210 of the connection member 200 may extend up to the ground 500 to contact the ground 500. Thus, a grounding effect may be improved.

As shown in FIGS. 3 and 4, the connection member 200 is pressed toward the PCB 300 and then coupled to the housing 600 by using a main fixing unit 410.

FIG. 4 is a cross-sectional view illustrating a structure in which the PCB 300 to which the connection member 200 and the power semiconductor device 100 are coupled is coupled to the inside of the housing 600. The housing 600 includes a plurality of pins each extending downward.

Here, a bolt as illustrated in FIGS. 3 and 4 may be used as the main fixing unit 410.

The bolt may pass through the flat plate part 210 of the connection member 200 and the PCB 300. Then, an end of the bolt is coupled to the housing 600 to press the power semiconductor device 100 toward the PCB 300, thereby firmly fixing the power semiconductor device 100 to the PCB 300.

An auxiliary fixing unit 420 may be disposed on a portion of the flat plate part 220 of the connection member 200 contacting the ground. A bolt may be used as the auxiliary fixing unit 420, like the main fixing unit 410.

The auxiliary fixing unit 420 presses the flat plate part 210 of the connection member 200 toward the ground 500 to couple the flat plate part 210 to the ground 500. Thus, the regular contact state between the connection member 200 and the flat plate part 210 may be firmly maintained.

Hereinafter, a process of assembling the power semiconductor device including the above-described constitutions with the PCB will be simply described.

First, the power semiconductor device 100 is connected to the PCB 300 through the soldering.

Then, the connection member 200 is placed on the power semiconductor device and the ground 500. Here, the flat plate part 210 of the connection member 200 and the ground 500 may be fixed to each other by the auxiliary fixing unit. Here, the soldering may be used as the auxiliary fixing unit 420.

Alternatively, as shown in FIGS. 3 and 4, the bolt may be used as the auxiliary fixing unit 420. Also, all of the soldering and the bolt may be used.

Next, the assembled PCB 300 is disposed within the housing 600 including the pins.

Then, the connection member 200 and the housing 600 are coupled to each other by using the bolt that is the main fixing unit 410.

The coupling between the connection member 200 and the ground 500 by the auxiliary fixing unit 420 may be performed after the PCB 300 is coupled to the housing 600.

According to the coupling structure and method, a coupling force between the power semiconductor device 100 and the PCB 300 may be increased. In addition, the electric efficiency may be improved, and also, heat may be more quickly dissipated through the connection member to improve the cooling efficiency.

Also, the grounding effect between the power semiconductor device 100 and the PCB 300 may be improved.

According to the embodiment, the connection member may press the power semiconductor device to couple the power semiconductor device to the PCB. Thus, the power semiconductor device may be more firmly fixed to the PCB. In addition, heat generated in the power semiconductor device may be dissipated through the connection member to improve the heat dissipation efficiency.

Also, since the connection member is connected to the plurality of legs of the power semiconductor device so that current flows, the passage through which the current flows may be increased in area and decreased in resistance. Thus, the heat generation amount of the power semiconductor device may be reduced. Therefore, the electric efficiency may be improved.

Also, the connection member may directly extend up to the ground and be connected to the ground to improve the grounding effect.

If a person of ordinary skill in the art to which this invention pertains without departing from the essential characteristics of the present invention in the range described above, is only the spirit of the present invention have been described for illustrative purposes, various modifications, additions and substitutions are possible.

Therefore, to explain the embodiments disclosed in the present disclosure is not limited to the technical idea of the present disclosure, and are not limited by this embodiment without departing from the scope or spirit of the invention.

The scope of protection of the present disclosure, all the technical idea, within the scope of its equivalent shall be construed by the following claims should be construed as being included in the scope of the present disclosure.

What is claimed is:

1. A coupling assembly of a power semiconductor device and a printed circuit board (PCB), the coupling assembly comprising:
    a PCB;
    a power semiconductor device comprising a plurality of legs electrically connected to a circuit pattern disposed on the PCB;
    a connection member disposed above the power semiconductor device, the connection member being formed of an electrically conductive material;
    a main fixing unit fixing the power semiconductor device to the PCB; and
    a housing disposed outside the PCB,
    wherein the connection member comprises:
    a flat plate part contacting an upper portion of the power semiconductor device; and
    a wing part extending downward from an end of the flat plate part,
    wherein an end of the wing part conductively contacts to the legs of the power semiconductor device.

2. The coupling assembly according to claim 1, wherein at least one wing part is provided, and
    the plurality of legs conductively contacts one wing part.

3. The coupling assembly according to claim 2, wherein a vertical extending angle of the wing part is closer to a vertical state than a vertical extending angle of each of the legs of the power semiconductor device.

4. The coupling assembly according to claim 2, wherein the flat plate part surface-contacts a top surface of the power semiconductor device.

5. The coupling assembly according to claim 1, wherein a ground is disposed on the PCB, and
    the connection member extends up to the ground.

6. The coupling assembly according to claim 5, further comprising an auxiliary fixing unit pressing and fixing the connection member to the ground.

7. A method for manufacturing the coupling assembly of the power semiconductor device and the PCB according to claim 1, the method comprising:
    soldering the power semiconductor device to the PCB to couple the power semiconductor device to the PCB;
    disposing the connection member on the upper portion of the power semiconductor device;
    disposing the PCB on which the connection member is disposed on the upper portion thereof within the housing; and
    coupling the connection member, the PCB, and the housing to each other by using the main fixing unit.

8. A method for manufacturing the coupling assembly of the power semiconductor device and the PCB according to claim 2, the method comprising:
    soldering the power semiconductor device to the PCB to couple the power semiconductor device to the PCB;
    disposing the connection member on the upper portion of the power semiconductor device;
    disposing the PCB on which the connection member is disposed on the upper portion thereof within the housing; and
    coupling the connection member, the PCB, and the housing to each other by using the main fixing unit.

9. A method for manufacturing the coupling assembly of the power semiconductor device and the PCB according to claim 3, the method comprising:
    soldering the power semiconductor device to the PCB to couple the power semiconductor device to the PCB;
    disposing the connection member on the upper portion of the power semiconductor device;
    disposing the PCB on which the connection member is disposed on the upper portion thereof within the housing; and
    coupling the connection member, the PCB, and the housing to each other by using the main fixing unit.

10. A method for manufacturing the coupling assembly of the power semiconductor device and the PCB according to claim 4, the method comprising:
    soldering the power semiconductor device to the PCB to couple the power semiconductor device to the PCB;
    disposing the connection member on the upper portion of the power semiconductor device;
    disposing the PCB on which the connection member is disposed on the upper portion thereof within the housing; and
    coupling the connection member, the PCB, and the housing to each other by using the main fixing unit.

11. A method for manufacturing the coupling assembly of the power semiconductor device and the PCB according to claim 5, the method comprising:
    soldering the power semiconductor device to the PCB to couple the power semiconductor device to the PCB;
    disposing the connection member on the upper portion of the power semiconductor device;
    disposing the PCB on which the connection member is disposed on the upper portion thereof within the housing; and
    coupling the connection member, the PCB, and the housing to each other by using the main fixing unit.

12. A method for manufacturing the coupling assembly of the power semiconductor device and the PCB according to claim 6, the method comprising:
    soldering the power semiconductor device to the PCB to couple the power semiconductor device to the PCB;
    disposing the connection member on the upper portion of the power semiconductor device;
    disposing the PCB on which the connection member is disposed on the upper portion thereof within the housing; and
    coupling the connection member, the PCB, and the housing to each other by using the main fixing unit.

13. The method according to claim 7, further comprising coupling the connection member to the ground by using the auxiliary fixing unit between the disposing of the connection member on the upper portion of the power semiconductor device and the disposing the PCB on which the connection member is disposed on the upper portion thereof within the housing, wherein the auxiliary fixing unit comprises at least one of soldering and a fixing bolt.

14. The method according to claim 8, further comprising coupling the connection member to the ground by using the auxiliary fixing unit between the disposing of the connection member on the upper portion of the power semiconductor device and the disposing the PCB on which the connection member is disposed on the upper portion thereof within the housing, wherein the auxiliary fixing unit comprises at least one of soldering and a fixing bolt.

15. The method according to claim 9, further comprising coupling the connection member to the ground by using the auxiliary fixing unit between the disposing of the connection member on the upper portion of the power semiconductor device and the disposing the PCB on which the connection member is disposed on the upper portion thereof within the housing, wherein the auxiliary fixing unit comprises at least one of soldering and a fixing bolt.

16. The method according to claim 10, further comprising coupling the connection member to the ground by using the auxiliary fixing unit between the disposing of the connection member on the upper portion of the power semiconductor device and the disposing the PCB on which the connection member is disposed on the upper portion thereof within the housing, wherein the auxiliary fixing unit comprises at least one of soldering and a fixing bolt.

17. The method according to claim 11, further comprising coupling the connection member to the ground by using the auxiliary fixing unit between the disposing of the connection member on the upper portion of the power semiconductor device and the disposing the PCB on which the connection member is disposed on the upper portion thereof within the housing, wherein the auxiliary fixing unit comprises at least one of soldering and a fixing bolt.

18. The method according to claim 12, further comprising coupling the connection member to the ground by using the auxiliary fixing unit between the disposing of the connection member on the upper portion of the power semiconductor device and the disposing the PCB on which the connection member is disposed on the upper portion thereof within the housing, wherein the auxiliary fixing unit comprises at least one of soldering and a fixing bolt.

* * * * *